United States Patent
Warren et al.

(10) Patent No.: US 11,120,990 B2
(45) Date of Patent: Sep. 14, 2021

(54) METHODS FOR DEPOSITING III-V COMPOSITIONS ON SILICON

(71) Applicants: Alliance for Sustainable Energy, LLC, Golden, CO (US); Colorado School of Mines, Golden, CO (US)

(72) Inventors: Emily Lowell Warren, Golden, CO (US); Theresa Emily Saenz, Golden, CO (US); Jeramy David Zimmerman, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/933,847

(22) Filed: Jul. 20, 2020

(65) Prior Publication Data

US 2021/0020437 A1    Jan. 21, 2021

Related U.S. Application Data

(60) Provisional application No. 62/876,218, filed on Jul. 19, 2019, provisional application No. 62/993,111, filed on Mar. 23, 2020.

(51) Int. Cl.
| | |
|---|---|
| *H01L 21/00* | (2006.01) |
| *H01L 21/02* | (2006.01) |
| *H01L 29/20* | (2006.01) |
| *H01L 29/06* | (2006.01) |

(52) U.S. Cl.
CPC .... *H01L 21/02433* (2013.01); *H01L 21/0243* (2013.01); *H01L 21/02373* (2013.01); *H01L 21/02538* (2013.01); *H01L 29/0657* (2013.01); *H01L 29/20* (2013.01)

(58) Field of Classification Search
None
See application file for complete search history.

(56) References Cited

U.S. PATENT DOCUMENTS

| 6,036,773 A * | 3/2000 | Wang | B82Y 10/00 |
| | | | 117/101 |
| 2018/0182622 A1* | 6/2018 | El Khoury Maroun | |
| | | | H01L 21/02433 |
| 2019/0378952 A1* | 12/2019 | Warren | H01L 21/02488 |

OTHER PUBLICATIONS

Al-Jassim, M. M. et al., "Structural and analytical studies of GaAs and GaP layers grown on silicon," Inst. Phys. Conf. Ser. No. 87: Section 2, paper presented at Microsc. Semicond. Mater. Conf., Oxford, Apr. 6-8, 1987, 6 pages.

Bringans, R.D., "Arsenic Passivation of Si and Ge Surfaces," Critical Reviews in Solid State and Materials Sciences, vol. 17, No. 4, 1992, 43 pages.

(Continued)

*Primary Examiner* — Richard A Booth
(74) *Attorney, Agent, or Firm* — Michael A. McIntyre

(57) ABSTRACT

The present disclosure relates to a method that includes directing a first precursor that includes a Group III element and a second precursor that includes a Group V element to a chamber containing crystalline silicon, where the crystalline silicon includes a substantially planar surface that is patterned with a plurality of v-grooves and the directing results in the forming of a III-V crystal preferentially on a (111) Si surface of the crystalline silicon.

20 Claims, 9 Drawing Sheets

(56) References Cited

OTHER PUBLICATIONS

Cho, Y-D. et al., "Process to Form V-Grooved Trenches on Patterned Si (001) Substrates Using In Situ Selective Area Etching in a MOCVD Reactor," ECS Journal of Solid State Science and Technology, vol. 5, No. 7, 2016, 3 pages.
Feifel, M. et al., "Direct Growth of a GaInP/GaAs/Si Triple-Junction Solar Cell with 22.3% AM1.5g Efficiency," Wiley Solar RRL, vol. 3, 2019, 7 pages.
Fonseka, H.A. et al., "High vertical yield InP nanowire growth on Si(111) using a thin buffer layer," IOP Nanotechnology, vol. 24, 2013, 10 pages.
Grassman, T.J. et al., "Nucleation-related defect-free GaP/Si(100) heteroepitaxy via metal-organic chemical vapor deposition," Applied Physics Letters, vol. 102, 2013, 4 pages.
Guo, W. et al., "Selective metal-organic chemical vapor deposition growth of high quality GaAs on Si(001)," Applied Physics Letters, vol. 105, 2014, 3 pages.
Han, Y. et al., "InGaAs/InP quantum wires grown on silicon with adjustable emission wavelength at telecom bands," IOP Nanotechnology, vol. 29, 2018, 7 pages.
Ismail, K. et al., "High-quality GaAs on sawtooth-patterned Si substrates," Applied Physics Letters, vol. 59, No. 19, Nov. 1991, 3 pages.
Koppka, C. et al., "Suppression of Rotational Twin Formation in Virtual GaP/Si(111) Substrates for III-V Nanowire Growth," Crystal Growth & Design, vol. 16, 2016, 6 pages.
Krost, A. et al., "Defect reduction in GaAs and InP grown on planar Si(111) and on patterned Si(001) substrates," Journal of Crystal Growth, vol. 145, 1994, 7 pages.
Kunert, B. et al., "III/V nano ridge structures for optical applications on patterned 300 mm silicon substrate," Applied Physics Letters, vol. 109, 2016, 5 pages.
Kvan, Eric P., "Interactions of Dislocations and Antiphase (Inversion) Domain Boundaries in III-V/IV Heteroepitaxy," Journal of Electronic Materials, vol. 28, No. 10, 1994, 6 pages.
Lepkowski, D.L. et al., "Investigation of Rear-Emitter GaAs0.75P0.25 Top Cells for Application to III-V/Si Tandem Photovoltaics," IEEE Journal of Photovoltaics, vol. 9, No. 6, Nov. 2019, 8 pages.
Li, S-Y. et al., "Selective Area Growth of GaAs in V-Grooved Trenches on Si(001) Substrates by Aspect-Ratio Trapping," Chin. Phys. Lett., vol. 32, No. 2, 2015, 4 pages.
Li, Q. et al., "Growing antiphase-domain-free GaAs thin films out of highly ordered planar nanowire arrays on exact (001) silicon," Applied Physics Letters, vol. 106, 2015, 4 pages.
Li, Q. et al., "Epitaxial growth of highly mismatched III-V materials on (001) silicon for electronics and optoelectronics," Progress in Crystal Growth and Characterization of Materials, vol. 63, 2017, 16 pages.
Lingunis, E.H. et al., "Thermal stress distributions in GaAs on sawtooth-patterned Si substrates: A finite element approach," Applied Physics Letters, vol. 61, No. 18, Nov. 1992, 3 pages.
Long, C. et al., "Growth and fabrication of semi-polar InGaN/GaN multi-quantum well light-emitting diodes on microstructured Si(001) substrates," Chinese Phys. B, vol. 24, No. 11, 2015, 4 pages.
Martensson, T. et al., "Epitaxial III-V Nanowires on Silicon," Nano Letters, vol. 4, No. 10, 20014, 4 pages.
Merckling, C. et al., "Heteroepitaxy of InP on Si(001) by selective-area metal organic vapor-phase epitaxy in sub-50 nm width trenches: The role of the nucleation layer and the recess engineering," Journal of Applied Physics, vol. 115, 2014, 6 pages.
Paladugu, M. et al., "Site Selective Integration of III-V Materials on Si for Nanoscale Logic and Photonic Devices," Crystal Growth & Design, vol. 12, 2012, 7 pages.
Paszuk, A. et al., "Double-layer stepped Si(100) surfaces prepared in As-rich CVD ambience," Applied Surface Science, vol. 462, 2018, 6 pages.
Perkins, C.L. et al., "Surfactant-assisted growth of CdS thin films for photovoltaic applications," J. Vac. Sci. Technol. A, vol. 24, No. 3, 2006, 8 pages.
Shi, B. et al., "MOCVD grown low dislocation density GaAs-on-V-groove patterned (001) Si for 1.3 um quantum dot laser applications," Applied Physics Letters, vol. 114, 2019, 5 pages.
Skinner, L.M. et al., "The Kelvin Equation—A Review," Aerosol Science, vol. 3, 1979, 12 pages.
Sobolev, M.S. et al., "Heteroepitaxy of GaP Nucleation Layers on Si by Molecular Beam Epitaxy," 26th International Symposium "Nanostructures: Physics and Technology," Semiconductors, vol. 52, No. 16, 2018, 4 pages.
Soga, T. et al., "The effects of the growth parameters on the initial stage of epitaxial growth of GaP on Si by metalorganic chemical vapor deposition," Journal of Crystal Growth, vol. 132, 1993, 7 pages.
Supplie, O. et al., "Metalorganic vapor phase epitaxy of III-V-on-silicon: Experiment and theory," Progress in Crystal Growth and Characteriazation of Materials, vol. 64, 2018, 30 pages.
Vaisman, M. et al., "GaAs Solar Cells on Nanopatterned Si Substrates," IEEE Journal of Photovoltaics, vol. 8, No. 6, Nov. 2018, 6 pages.
Volz, K. et al., "GaP-nucleation on exact Si(001) substrates for III/V device integration," Elsevier Journal of Crystal Growth, vol. 315, 2011, 11 pages.
Wan, Y. et al., "O-band electrically injected quantum dot micro-ring lasers on on-axis (001) GaP/Si and V-groove Si," Optics Express, vol. 25, No. 22, Oct. 2017, 8 pages.
Wang, Z. et al., "Room-temperature InP distributed feedback laser array directly grown on silicon," Nature Photonics, vol. 9, 2015, 7 pages.
Warren, E. et al., "Growth of antiphase-domain-free GaP on Si substrates by metalorganic chemical vapor deposition using an in situ AsH3 surface preparation," Applied Physics Letters, vol. 107, 2015, 4 pages.
Warren, E. et al., "Enabling low-cost III-V/Si integration through nucleation of GaP on v-grooved Si substrates," IEEE WCPEC-7 Proceedings, 2018, 3 pages.
Zhu, S. et al., "Electrically pumped 1.5 μm InP-based quantum dot microring lasers directly grown on (001) Si," Optics Letters, vol. 44, No. 18, Sep. 2019, 4 pages.

* cited by examiner (a) V/III=50, T=600°C  (b) V/III=50, T=700°C  (c) V/III=5,000, T=800°C

METHODS FOR DEPOSITING III-V COMPOSITIONS ON SILICON

CROSS-REFERENCE TO RELATED APPLICATIONS

This application claims priority from U.S. Provisional Patent Application Nos. 62/876,218 and 62/993,111 filed Jul. 19, 2019 and Mar. 23, 2020, respectively, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

SUMMARY

An aspect of the present disclosure is a method that includes directing a first precursor that includes a Group III element and a second precursor that includes a Group V element to a chamber containing crystalline silicon, where the crystalline silicon includes a substantially planar surface that is patterned with a plurality of v-grooves, each v-groove is characterized by a triangular cross-section defined by a bottom positioned between a first top and a second top, the bottom and the first top form a first sidewall, the bottom and the second top form a second sidewall, each sidewall includes a (111) Si surface, the second precursor and the first precursor are provided at a ratio between about 50:1 and about 50,000:1, the chamber is maintained at a temperature between about 600° C. and about 1000° C., and the directing results in the forming of a III-V crystal preferentially on the (111) Si surface.

In some embodiments of the present disclosure, the top may include a silicon surface other than a (111) Si surface. In some embodiments of the present disclosure, the top may include a (001) Si surface. In some embodiments of the present disclosure, the ratio may be between about 1,000:1 and about 10,000:1. In some embodiments of the present disclosure, the temperature may be between about 700° C. and about 900° C. In some embodiments of the present disclosure, the temperature may be between about 650° C. and about 850° C.

In some embodiments of the present disclosure, the chamber may be maintained at a pressure between about 1 Torr and about 800 Torr. In some embodiments of the present disclosure, may be between about 500 Torr and about 760 Torr. In some embodiments of the present disclosure, the pressure may be between about 1 Torr and about 100 Torr. In some embodiments of the present disclosure, the Group III element may include at least one of gallium, indium, and/or aluminum. In some embodiments of the present disclosure, the Group V element may include at least one of phosphorus, arsenic, and/or nitrogen. In some embodiments of the present disclosure, the III-V crystal may include at least one of GaP, GaAs, InP, InAs, GaAsP, GaNP, and/or GaInP.

In some embodiments of the present disclosure, the method may further include, prior to the directing, a first initial directing of at least one of arsine ($AsH_3$) or tertiary-butylarsine (TBAs) to the chamber, where the chamber is maintained at a first initial temperature between 900° C. and 1000° C., and the first initial directing modifies the (111) Si surface. In some embodiments of the present disclosure, the method may further include, after the first initial directing and prior to the directing, a second initial directing of at least one of phosphine ($PH_3$) or TBAs to the chamber, where the chamber is maintained at a second initial temperature between 850° C. and 1100° C., and the second initial directing modifies the (111) Si surface.

In some embodiments of the present disclosure, the III-V crystal may coalesce to a conformal coating that covers substantially all of the surface. In some embodiments of the present disclosure, the conformal coating may be substantially planar. In some embodiments of the present disclosure, the conformal coating may include GaP. In some embodiments of the present disclosure, a distance normal to the surface between the top and the bottom may define a depth that is between about 10 nm and 10 μm. In some embodiments of the present disclosure, a distance between adjacent tops may define a width that is between about 10 nm and 10 μm. In some embodiments of the present disclosure, the conformal coating may have thickness between about 1 nm and 10 μm, as measured from the top of the v-groove to an outer surface of the conformal coating.

An aspect of the present disclosure is a composition that includes a crystalline silicon substrate that has a substantially planar surface that is patterned with a plurality of v-grooves, where each v-groove is characterized by a triangular cross-section defined by a bottom positioned between a first top and a second top, the bottom and the first top form a first sidewall, the bottom and the second top form a second sidewall, each sidewall includes a (111) Si surface, and the composition further includes a conformal coating that includes GaP, where the conformal coating fills the v-grooves and substantially covers the planar surface, and the conformal coating forms a substantially planar outer surface.

BACKGROUND

Work on v-grooved silicon has focused on fabricating optoelectronic devices on the v-grooved substrates and efforts to reduce threading dislocation density necessary for such devices through optimization of buffer layers and dislocation filters. Because of the fundamental differences between v-grooves and planar substrates, the large body of work addressing nucleation on planar (001) or (111) cannot be assumed to translate to v-groove as v-grooves are significantly more complex, coming with multiple crystallographic planes intersecting in regions with complex surface reconstructions. There is therefore a need to explore the large parameter space that effects nucleation, from growth conditions to surface pretreatment, to better understand what regimes of nucleation exist for III-V on v-groove silicon and to provide quality silicon/III-V compositions suitable for various semiconductor-containing industries and applications.

BRIEF DESCRIPTION OF DRAWINGS

Some embodiments are illustrated in referenced figures of the drawings. It is intended that the embodiments and figures disclosed herein are to be considered illustrative rather than limiting.

Figure 1A:
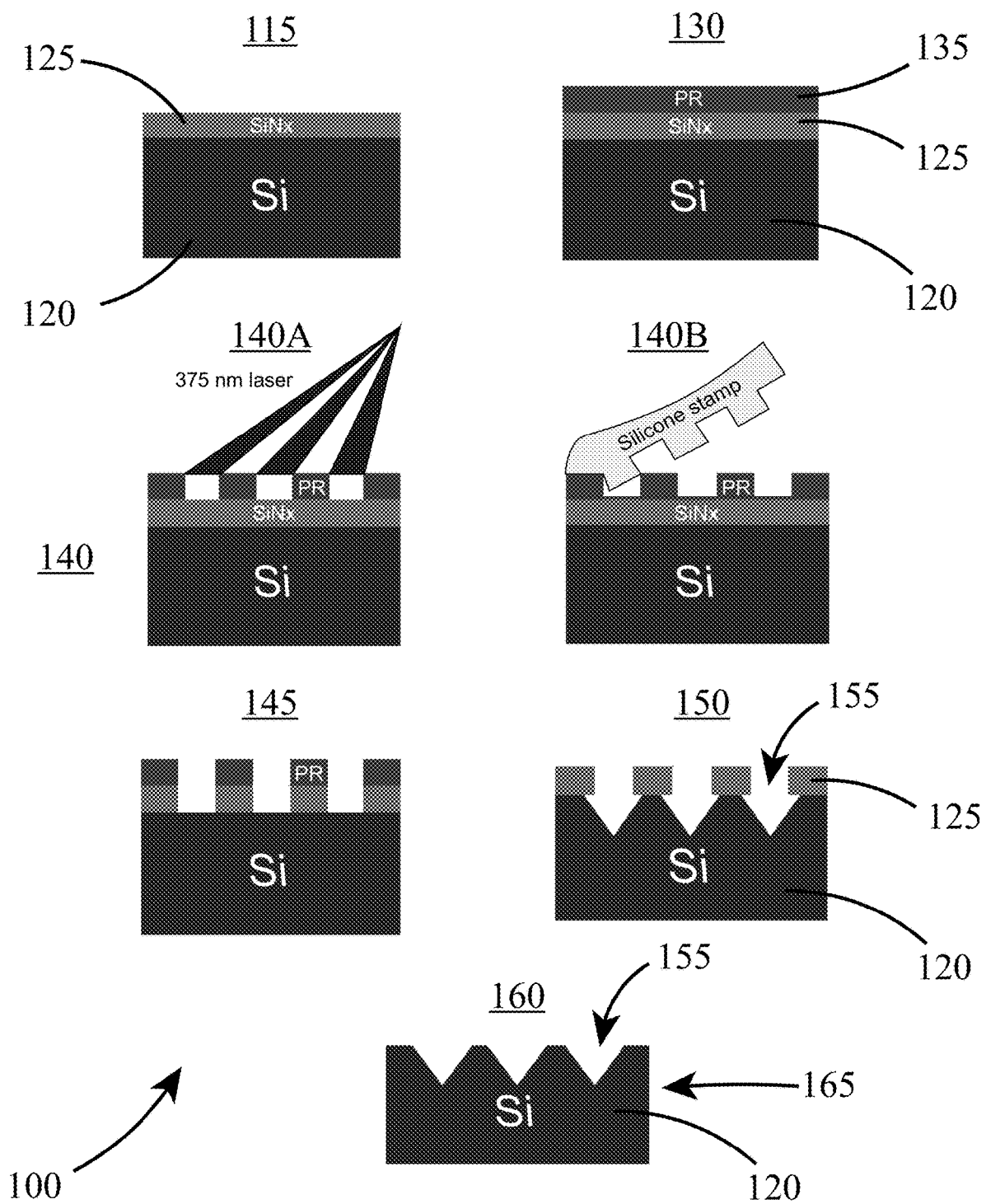
FIGS. 1A and 1B illustrate a method for producing a III-V/silicon composite composition, according to some embodiments of the present disclosure.

| REFERENCE NUMBERS | |
|---|---|
| 100 | method |
| 110 | III-V/Si composition |
| 115 | first deposition |
| 120 | silicon substrate |
| 125 | silicon nitride layer |
| 130 | second deposition |
| 135 | photoresist layer |
| 140 | patterning |
| 145 | removing |
| 150 | etching |
| 155 | patterns (i.e. v-grooves) |
| 160 | exposing |
| 165 | patterned silicon substrate |
| 167 | annealed silicon substrate |

| REFERENCE NUMBERS | |
|---|---|
| 175 | surface |
| 180 | top |
| 185 | bottom |
| 190 | sidewall |
| 192 | depth |
| 193 | width |
| 194 | thickness |
| 195 | annealing |
| 197 | growing |
| 198 | starting III-V crystal |
| 199 | conformal III-V coating |

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Among other things, the present disclosure relates to methods for directing nucleation exclusively on one crystallographic plane of a nanopatterned silicon substrate (e.g. wafer) to create high-quality III-V semiconductors on silicon. High-quality III-V semiconductors grown on silicon are of interest for a variety high performance optoelectronic devices and have been one of the dominant challenges facing the epitaxy community for decades. As described herein, (001) silicon wafers were patterned with v-grooves that expose (111)-type silicon planes. This surface patterning, among other things, can eliminate antiphase domain boundary (APB) formation. However, the fabrication of perfect v-groove corrugated surfaces that are made of only (111) type planes is difficult and may not be stable during growth processes. A small amount of (001) or other surface may be exposed at the peaks of the v-groove. To eliminate APB type defects, it is desirable to limit nucleation to the (111)-type surfaces. Different nucleation regimes were observed for various growth conditions with scanning electron microscopy (SEM). In some embodiments of the present disclosure, nucleation at high temperatures and high V/III ratios (i.e. VIII ratios) was found to produce uniform nucleation at the bottom of v-grooves with the resultant GaP free of nucleation-related defects.

Thus, described herein are methods that use growth parameters such as temperature, V/III ratio, and pre-growth annealing under appropriate hydride (e.g. AsH$_3$ and/or PH$_3$) environments to direct nucleation exclusively onto one type of crystallographic plane (e.g. (111)-type) on a nanopatterned silicon wafer with various exposed crystallographic planes. The nanopatterned silicon wafers studied herein were patterned to achieve a v-groove structure as described in more detail below. By controlling the growth temperature (e.g. between 600° C. and 1000° C.) and V/III ratio (e.g. between 50:1 and 50,000:1), both GaP and/or GaAs were directed to nucleate exclusively in the bottom of the grooves on the (111)-surface. This is notable because the (111)-Si surface is typically much more inert than the (001)-surface. Under lower temperatures, preferential growth on the (001)-surface was observed. As shown herein, these parameters direct the growth of high-quality III-V materials without the formation of stacking faults, eliminating the need for methods to remove the stacking faults from subsequent growth, greatly simplifying design, cost, and scalability of the process. Although GaP is demonstrated herein, other III-V layers may be deposited on v-groove silicon substrates using the method described herein, including indium and/or aluminum (Group III elements) and/or arsenic and/or nitrogen (Group V elements). Thus, in some embodiments of the present disclosure at least one of a binary III-V alloy and/or a ternary III-V alloy may be deposited onto v-groove patterned silicon substrates, including at least one of GaP, GaA, InP, InAs, GaAsP, GaNP, and/or GaInP.

Dislocation densities in III-V materials may be reduced by increasing the nucleation site density by growing at low temperatures and high V/III ratio. As described herein, these are the opposite conditions to which clean nucleation was observed on (111)-type planes at the bottom of the v-groves. As shown herein, by performing the correct surface pretreatment using a passivating high temperature (e.g. between 900° C. and 1000° C.) Group V anneal and growing under conditions that give rise to high reactant mobility, the geometry of the v-groove tends to have a larger effect on nucleation than the relative reactivity of the (111) and (001) surfaces. In some embodiments of the present disclosure, this can result in nucleation being directed to at least one of the bottom and/or sidewalls of the v-grooves.

Figure 1B:
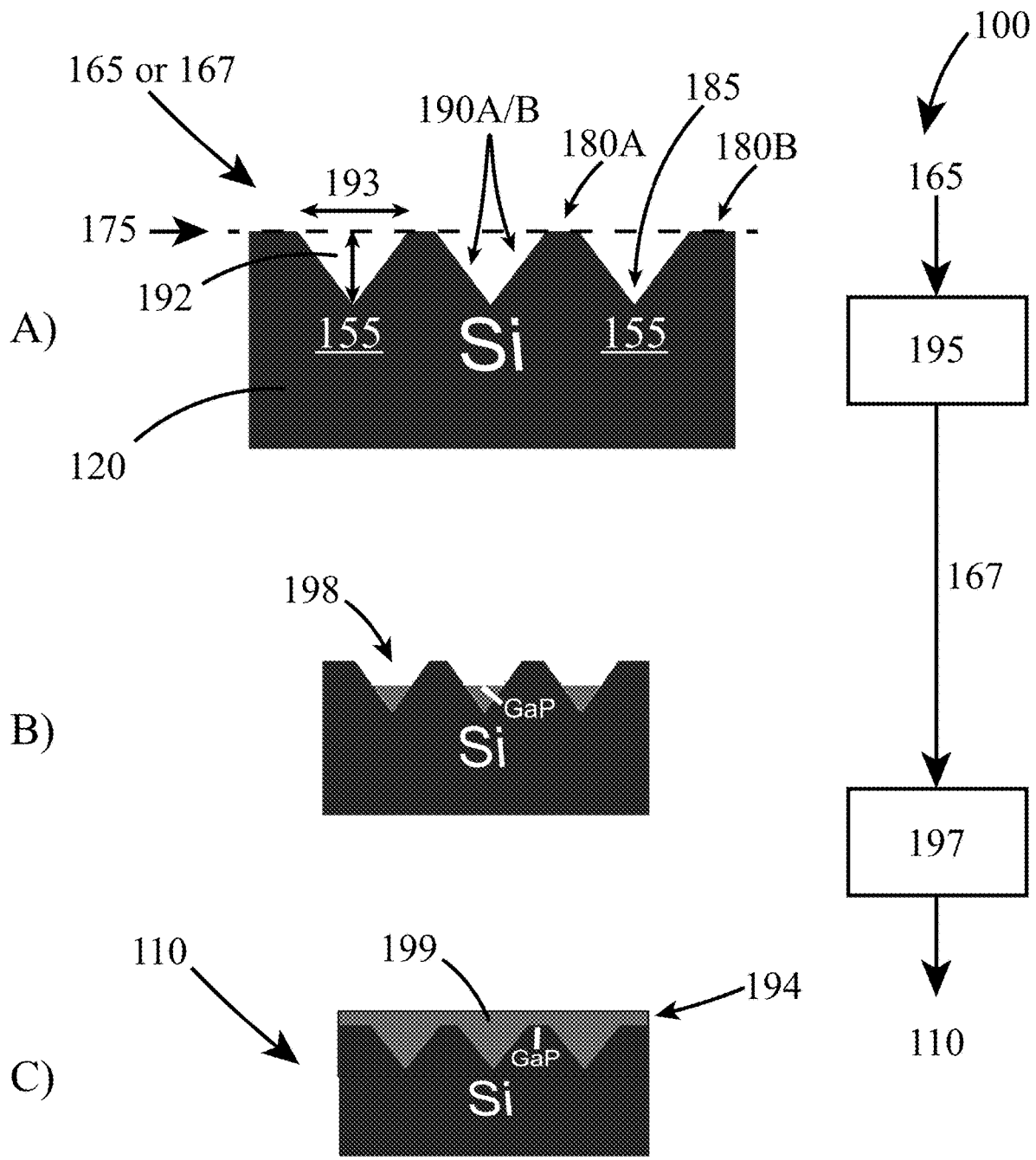

FIGS. 1A and 1B illustrate an exemplary method 100 for producing III-V/Si compositions 110, according to some embodiments of the present disclosure. As described in more detail below, the method 100 may begin with a first deposition 115 of a silicon nitride layer 125 onto a silicon substrate 120. The first deposition 115 of the silicon nitride layer 125 may be accomplished using, among other methods, a chemical vapor deposition method. The method 100 may proceed with a second deposition 130 of a photoresist layer 135 onto the silicon nitride layer 125. Next, the silicon nitride layer 125 and the photoresist layer 135 may be subjected to patterning 140 to nanoscale resolution to expose only the surfaces of the silicon substrate 120 to be subjected to subsequent processing steps. Among other methods, this may be accomplished by laser interference lithography 140A or by nanoimprint lithography 140B.

Referring again to FIG. 1A, the method 100 may continue with the removing 145 of any residual silicon nitride layer 125 and/or photoresist layer 135 to produce clean silicon substrates between the remaining nanopatterned silicon nitride layers 125 and photoresist layers 135. The removing 145 of these layers may be achieved by reactive ion etching. The method may then proceed with the etching 150 of the exposed silicon substrate 120 to produce the desired patterning 155, e.g. v-grooves, etched into the outer planar surface of the silicon substrate 120. The etching 150 to produce the desired patterns 155 in the silicon substrate (e.g. v-grooves) may be achieved using a highly selective and anisoptropic KOH etching procedure. Finally, the patterns 155 in the silicon substrate 120 may be prepared for the subsequent deposition of a III-V semiconductor layer 170, as described in detail below, by exposing 160 the silicon substrate 120 to a chemical, e.g. HF, to produce the targeted patterned silicon substrate 165.

FIG. 1B illustrates how the exemplary method 100 started in FIG. 1A to produce a patterned silicon substrate 165 may continue to produce the targeted III-V/Si composition 110, constructed of a conformal III-V coating 199 positioned onto a patterned silicon substrate 165, as described herein. The method 100 may produce a III-V/Si composition 110 by exposing the patterned silicon substrate 165 to an annealing 195, resulting in the forming of an annealed silicon substrate 167, followed by a growing 197 step, where the conformal III-V coating 199 is deposited onto the annealed silicon substrate 167 to produce the final targeted III-V/Si composition 110. Referring again to FIG. 1B, Panel A) illustrates further detail of an exemplary patterned silicon substrate 165, according to some embodiments of the present disclosure. The empty cross-sectional area of a v-groove pattern 155 (three shown in Panel A)) describes an inverted triangle, where the three points of the triangle are a first "top" 180A, a second "top" 180B, and a "bottom" 185. The first top 180A and the second top 180B are positioned in the plane making up the outer surface 175 of the silicon substrate. The width 193 of a v-groove 155 is defined by the distance between opposing sides of the v-groove 155 and may range between 10 nm and 10 µm or between 50 nm and 1 µm. The depth 192 of a v-groove 155 is the vertical distance from the outer surface 175 of the silicon substrate to the bottom 185. The depth 192 of a v-groove may range between 10 nm and 10 µm or between 50 nm and 1 µm. The surfaces between the bottom 185 of a v-groove 155 and its corresponding tops (180A and 180B) are referred to herein as sidewalls 190. Thus, each v-groove 155 has two sidewalls (190A and 190B).

Figure 8:
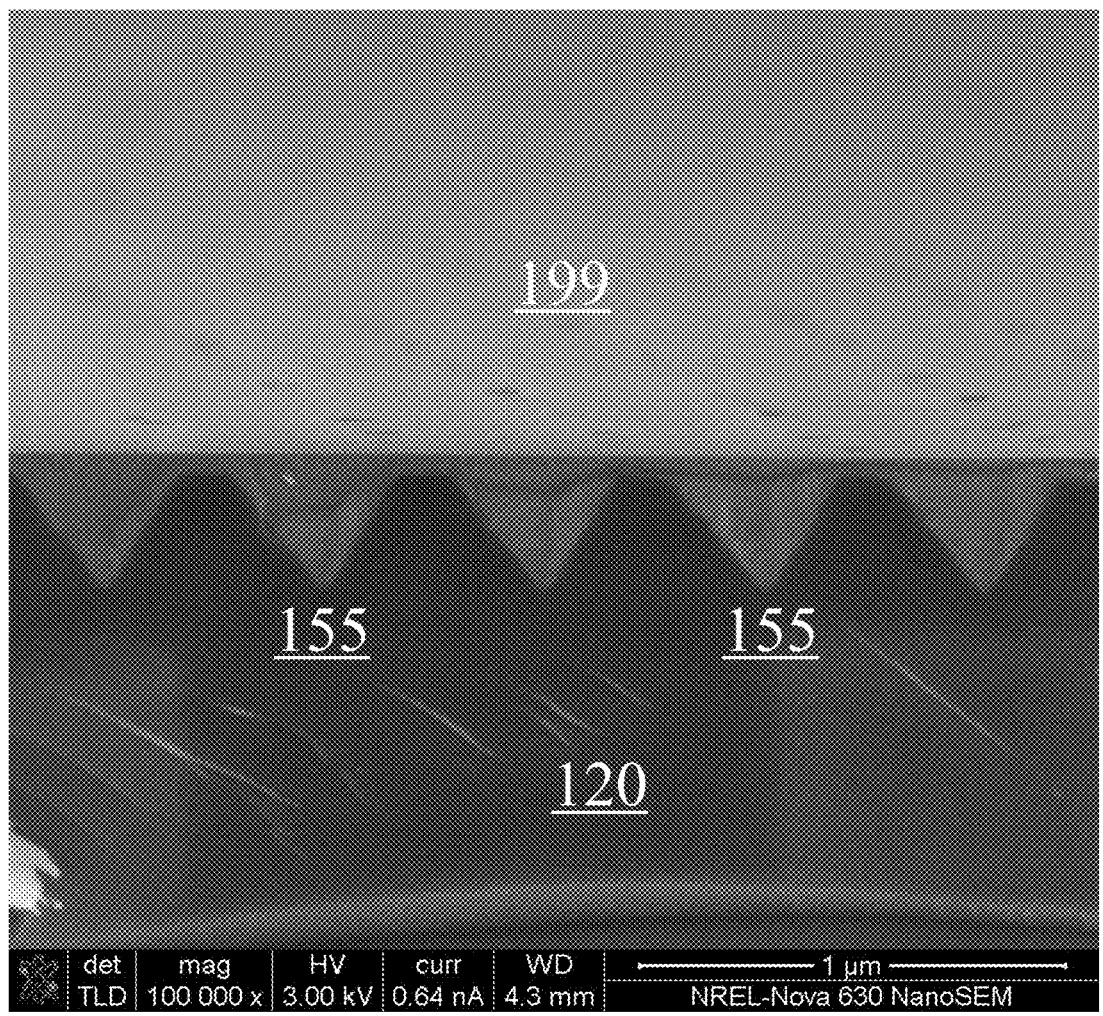
FIG. 8 illustrates a conformal GaP layer covering a patterned silicon substrate, according to some embodiments of the present disclosure.

Referring again to FIG. 1B, the right-hand side of the figure illustrates the steps described herein to deposit a conformal III-V coating 199 onto a patterned silicon substrate 165 to produce a III-V/Si composition 110. As shown, the method 100 may continue with the annealing 195 of the patterned silicon substrate 165, resulting in the forming of an annealed silicon substrate 167. As described in more detail below, the annealing 195 treats the surfaces of the patterned silicon substrate 165, e.g. the sidewalls 190, the tops 180, and the bottoms 185, to enable better growth of the conformal III-V coating 199 both into the v-grooves 155 and onto the tops 180 of the v-grooves 155. As shown in Panel B) of FIG. 1B, and as described in more detail below, a starting III-V crystal 198 may begin to form on the sidewalls 190 of a v-groove 155 towards the bottoms 185 of the v-grooves 155. The top-most surface of the starting III-V crystal 199 may be substantially planar and parallel to the outer surface 175 of the silicon substrate 120. Eventually, as the v-grooves are filled by the growing III-V crystal, the conformal III-V coating 199 will begin to form as the tops 180 of the v-grooves and any remaining exposed outer surface 175 of the silicon substrate 120 are covered by the III-V crystal. The growing 197 may conclude when sufficient thickness is obtained to completely cover the silicon substrate, forming a substantially planar, conformal III-V coating 199 and resulting in the targeted III-V/Si composition 110. The thickness 194 of a conformal III-V coating 199 may range between 1 nm and 10 µm or between 2 µm and 5 µm. An example of such a composition is shown in FIG. 8. The GaP conformal coating shown in FIG. 8 was grown on a v-groove patterned silicon substrate at a pressure of 620 Torr, a temperature of 800° C., and a V/III ratio of 5,000. After 40 minutes, growth proceeded with a flat (001) Si surface as it filled the v-grooves. Some pitting is visible above the (001) Si surface.

In more detail, in some embodiments of the present disclosure, V-grooved silicon substrates were prepared using nanoimprint lithography to pattern chemical-mechanical polished, exactly-oriented (001) Si n-type, 0.04-0.06 Ω-cm, wafers with plasma enhanced chemical vapor deposition-grown $SiN_x$. Reactive ion etching was used to transfer the pattern to the $SiN_x$, and 45% KOH at 50° C. was used to form the v-grooves. The width of the v-grooves was 300 nm. The v-grooves were not prepared to have sharp tips, but rather had some (001)-oriented surface remaining. Just prior to growth, the silicon was wet etched in 2% HF to remove residue from the KOH etch, followed by a 4:1 96% $H_2SO_4$: 30% $H_2O_2$ piranha etch to clean the substrates, and finally was etched in 10% HF for four minutes to remove oxide formed in the piranha etch as well as the $SiN_x$ caps on the matrix.

In some embodiments of the present disclosure, III-V semiconductors, e.g. GaP and/or GaAs, were grown on silicon in a vertical atmospheric organo metallic vapor phase epitaxy (OMVPE) reactor using $AsH_3$, $PH_3$, and trimethyl gallium (TMGa) as precursors, operated at a pressure between about 1 Torr and 800 Torr, or between 500 Torr and 760 Torr. To study the different growth regimes, nucleation was carried out at 600° C., 700° C., and 800° C., with V/III ratios of 50, 500, and 5,000 at each temperature, and at 620 Torr. Prior to growth, samples were subjected to a one-minute $AsH_3$ anneal ($P_{AsH3}$=0.3 torr in $H_2$ ambient) at 850° C. and at 620 Torr total pressure and about 1 Torr arsine partial pressure. Samples where then allowed to cool to the growth temperature under $AsH_3$ at 620 torr total pressure and about 1 Torr arsine partial pressure. The Group-V flow was switched from $AsH_3$ to $PH_3$ 30 seconds prior to the start of growth. To probe the effect of the $AsH_3$ anneal, an additional growth was carried out with a 40-minute $H_2$ anneal at 900° C. at 620 Torr rather than the $AsH_3$ anneal prior to growth. The samples were imaged in a JEOL JSM-7000F field emission SEM at 10 keV after growth to identify the locations of nucleation on the v-grooves. Other precursors for supplying the III-V elements for depositing III-V conformal coatings onto silicon substrates, according to some embodiments of the present disclosure, include at least one of triethylgallium, tertiarybutyl phosphine, bisphosphinoethane, tertiarybutyl arsine, monoethyl arsine, and/or trimethyl arsine.

Figure 2:
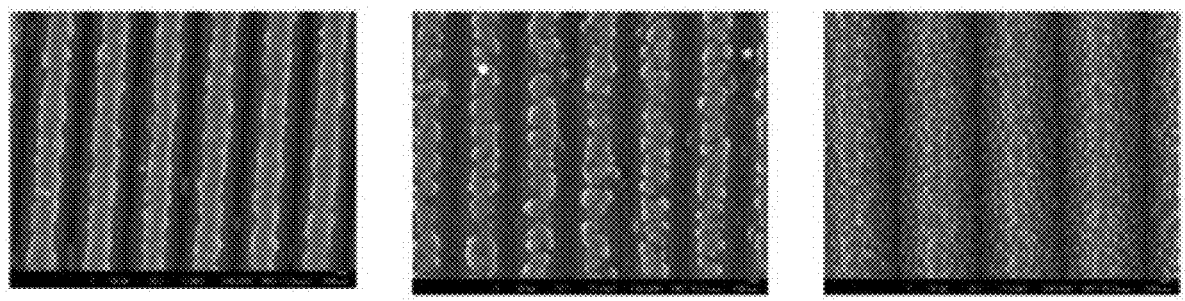
FIG. 2 illustrates exemplary compositions formed using methods described herein, according to some embodiments of the present disclosure.

Nucleation studies were carried out on substrates with and without exposed (001)-Si between (111) v-grooves at the tops to understand the difference between the two facets in nucleation. The nucleation was characterized using SEM and transmission electron microscopy (TEM). Additionally, low energy electron diffraction measurements were made to help understand some of the trends observed by SEM. This work has demonstrated a path to control the facet selectivity of nucleation between (111) and (001) surfaces, which will determine the patterning and etching requirements for nanopatterning of the silicon substrate. Results are shown in FIG. 2 for the production of GaP on silicon v-groove substrates. The left panel in FIG. 2 illustrates the composition resulting from an $AsH_3$ anneal only, with nucleation occurring primarily on the (001) Si tops of the v-grooves. The center panel illustrates the composition resulting from an $AsH_3$ anneal followed by a two-minute $PH_3$ anneal, with nucleation occurring both on the (001) Si tops and the (111) Si sidewalls towards the bottoms of the v-grooves. The right panel in FIG. 2 illustrates the composition resulting from an $AsH_3$ anneal followed by a five-minute $PH_3$ anneal, with nucleation occurring over many of the silicon surfaces.

To understand the substrate surface just prior to the beginning of growth, pieces of (001)- and (111)-oriented silicon were subjected to the same wet chemical pretreatment as the growth sample, annealed with the $AsH_3$ treatment, cooled to the corresponding growth temperature, and exposed to the 30 seconds of $PH_3$ flow that the samples would be exposed to prior to growth. Instead of then starting growth, the samples were allowed to cool under $N_2$. This was done for growth conditions corresponding to the three distinct growth regimes observed by SEM.

Angle-integrated XPS data were acquired on a customized Physical Electronics 5600 XPS system. Samples were transferred through air and measured as-received. All spectra were taken at near-normal electron exit angle (6°) using monochromatic Al Kα radiation. Wide scan survey spectra were taken at a pass energy of 188 eV. High resolution spectra were taken at 11.8 eV pass energy. Composition was determined using the ULVAC-PHI Multipak v9.6.1.7 software package and default elemental sensitivity factors. To probe crystalline quality, TEM was used to image the crystal lattice of nuclei from the three growth regimes investigated by XPS.

Figure 3:
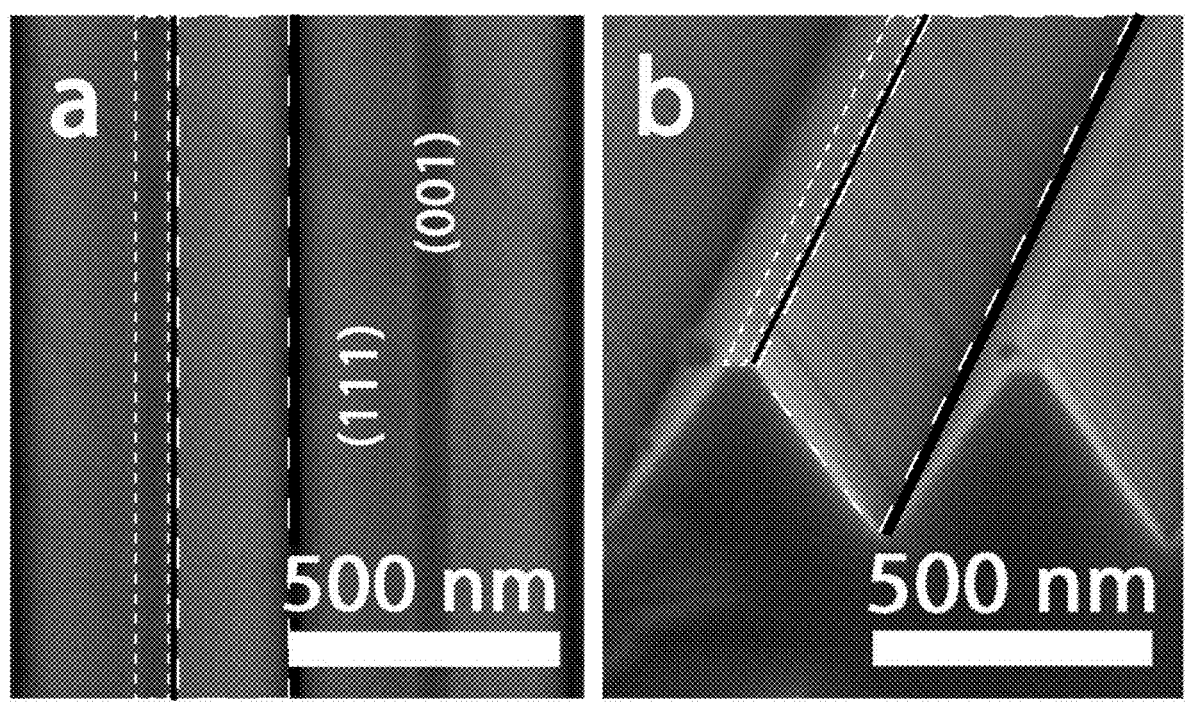
FIG. 3 illustrates SEM images in plan view (a) and cross section (b) of a v-grooved silicon substrate prior to growth, according to some embodiments of the present disclosure.

To understand the results of the nucleation study on v-groove silicon, it is necessary to have a clear picture of the substrate and the different possibilities of where the nucleation can occur. FIG. 3 shows a SEM in plan view and cross section of a v-groove substrate prior to growth. The (001)-oriented (top) area is enclosed in the light short-dashed box, the thin dark line is at the interface between (001) and (111)-type planes (top edge), the (111)-oriented (sidewall)

area is enclosed in the light long-dashed box, and the thick dark line at the interface between (111) and ($\bar{1}\bar{1}1$) planes (bottom), according to some embodiments of the present disclosure.

As shown in the SEM image of FIG. 3, there are essentially four crystallographically unique locations on the substrate: the (001) surface that was capped during the KOH etch at the top of the groove, the (111) surfaces within the v-grooves (sidewalls), and two interface regions between the (001) and (111) (top edge) and opposing (111) (bottom) surfaces, respectively. From the TEM imaging shown below, it appears that these interfacial regions are on the order of tens of atomic layers thick and have a surface reconstruction that is not well understood. They are, however, significant because, in many cases nucleation appears to proceed from them. There is some sort of texturing visible on the (111) surfaces that could come from imperfect alignment of the trenches with the [1$\bar{1}$0] direction.

Figure 4:
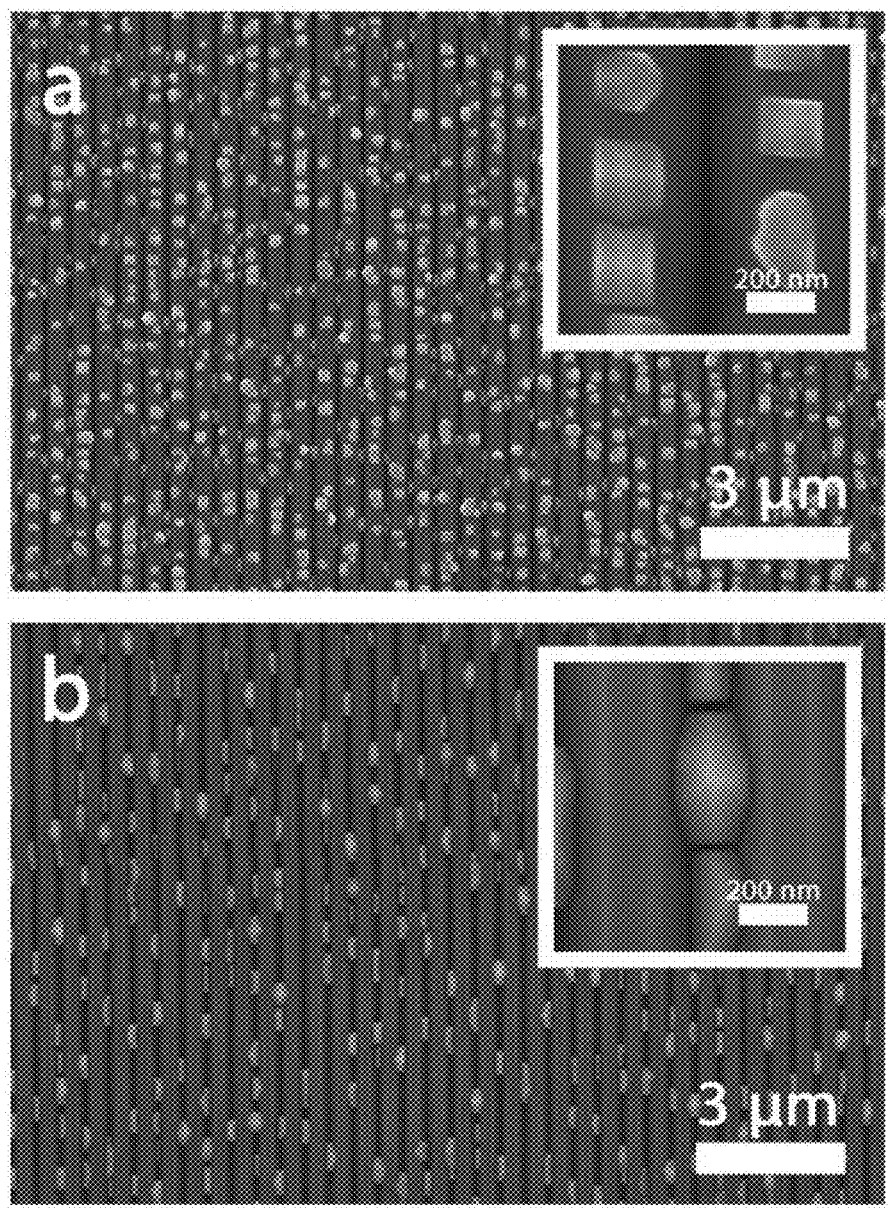
FIG. 4 illustrates SEM of GaP nucleation carried out with a V/III=50° C. and T=700° C. after an $H_2$ anneal at 900° C. for 40 minutes (see Panel (a)) and a one-minute $AsH_3$ anneal at 850° C. (see Panel (b)), according to some embodiments of the present disclosure. In Panel (a), nucleation begins primarily on the (001) surface, but in Panel (b), nucleation appears to begin exclusively at the sidewalls towards the bottom of the v-grooves.

A nucleation study to compare $AsH_3$ and $H_2$ pre-growth anneals was performed, using the methods described herein. FIG. 4 compares large area SEM images of GaP nucleation after a 40-minute $H_2$ pre-growth anneal at 900° C. (see Panel (a) of FIG. 4) and a one-minute $AsH_3$ pre-growth anneal at 850° C. (see Panel (b) of FIG. 4). Both growths were carried out with a V/III ratio of about 50:1 and at a temperature of about 700° C. The SEM images show that growth primarily began on the (001) surface for the $H_2$ anneal, with some nucleation at the bottom of the grooves. For the $AsH_3$ anneal, all nucleation began on the sidewalls at the bottom of the grooves. This condition is apparently needed to take advantage of the defect-reducing symmetry of the v-grooves. Based on this result, the rest of studies described below were carried out using the $AsH_3$ anneal.

Figure 5:
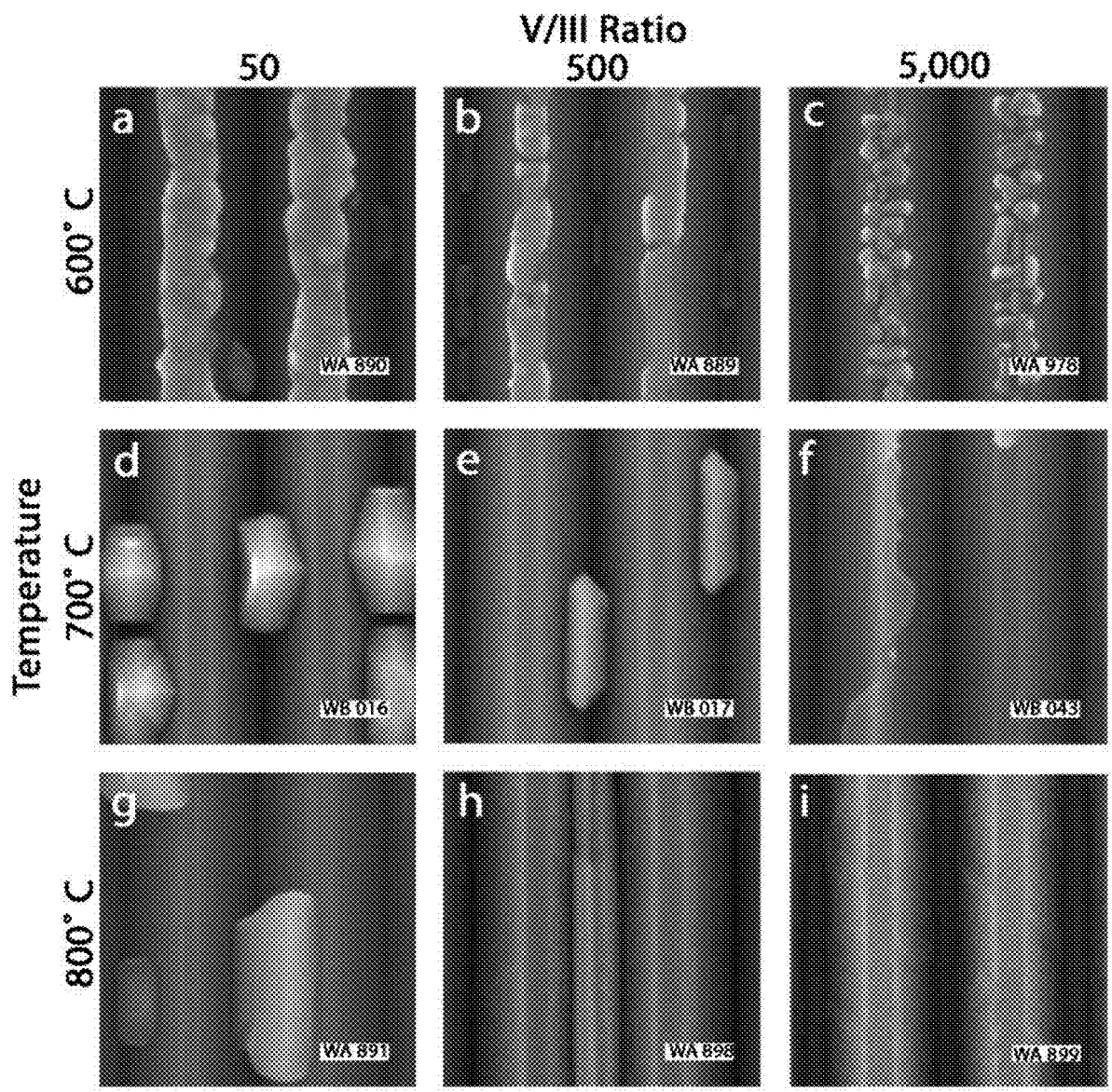
FIG. 5 illustrates SEM images of GaP on v-groove silicon nucleation under various growth conditions, according to some embodiments of the present disclosure. The scale bar is 250 nm and contains NREL run numbers for reference. All nucleations carried out at 600° C. primarily began on the top surface. At 700° C. and V/III of 50° C. and 500° C., as well as 800° C. and V/III of 50, relatively small, highly faceted nuclei form at the bottom of the grew exclusively on the sidewalls from the bottoms of the v-grooves. At 700° C. and V/III of 5,000, the growth appeared to begin on either the top surface or the top edge interface and proceed down the sidewalls. At 800° C. and V/III=500 and 5,000, growth began exclusively on the sidewalls towards the bottom of the v-grooves and formed long (10s of μm) wire-like nuclei down the length of the v-grooves.

FIG. 5 shows the results of a parameter sweep of V/III ratio and temperature for GaP nucleation. Three regimes of nucleation can be identified: The first is where nucleation occurs primarily on the top surface, including Panels (a)-(c) and (f) of FIG. 5. Experiments growing GaP on v-grooved silicon were performed at three temperatures: 600° C., 700° C., and 800° C. The ratio of phosphide precursor to gallium precursor was varied between three settings: 50, 500, and 5,000. All growth reactions were carried out at 620 Torr. The 700° C. growth appears unlike the others in this regime in that growth seems to start on the top surface or top edge interface and proceed down the sidewalls, so it is possible that a different factor is affecting the nucleation in this case. The second regime is the nucleation of highly-faceted islands with a length around 500 nm or less, including Panels (d), (e), and (g) of FIG. 5. The scale-bars in FIG. 5 correspond to 250 nm. In large area SEM images, these all appear to nucleate at the bottom interface. The density of nuclei on the surface varies depending on the condition for this regime. Finally, the third regime consists of nuclei 2 μm or longer that form exclusively on the sidewalls towards the bottom interface, as in Panels (h) and (i) of FIG. 5 and show minimal faceting.

Figure 6:
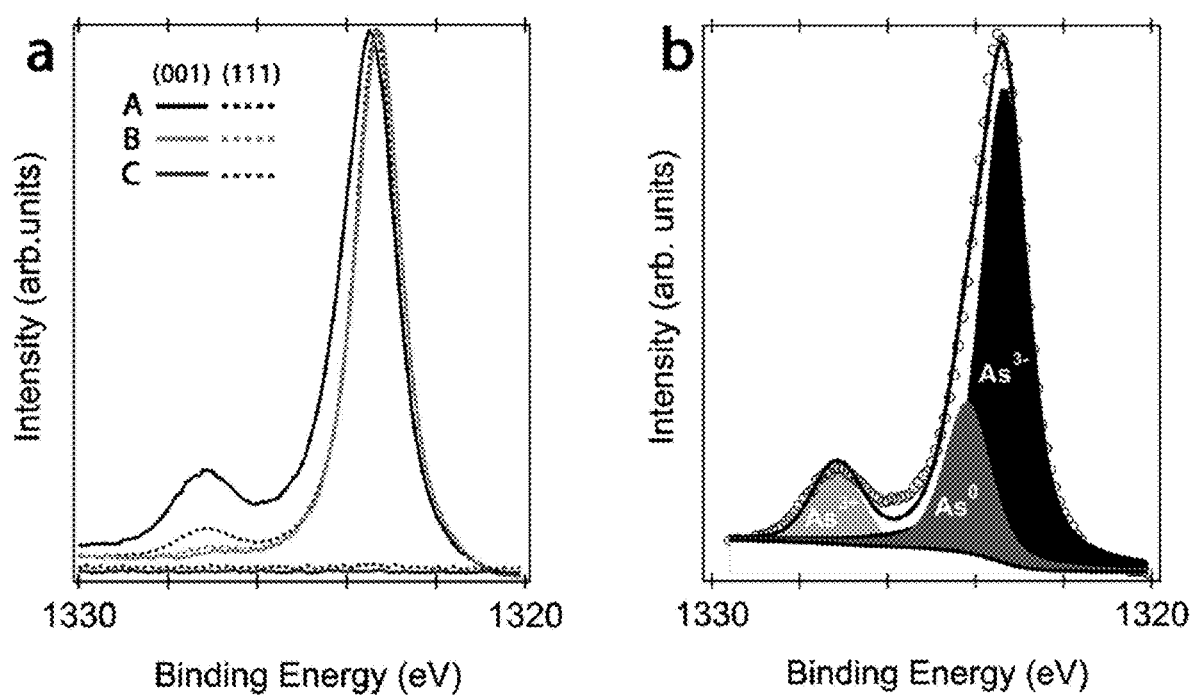
FIG. 6 illustrates: Panel (a) XPS spectra of the silicon (111) and (001) surfaces corresponding to surface conditions just prior to the beginning of nucleation for the three identified nucleation regimes, according to some embodiments of the present disclosure. Reactor conditions were: A: 600° C., equivalent V/III=50, B: 700° C., equivalent V/III=50, and C: 800° C., equivalent V/III=5,000. No Ga was flown, so the V/III ratio indicates the Group V ow that corresponds to that growth condition. The samples showing As peaks are normalized to the $As^{3-}$ peak. Panel (b) illustrates peak fitting of Condition A on (001) Si. The $As^0$ peak was negligible for all other samples.

To understand the silicon surface just prior to nucleation (just after the arsine and phosphine anneals), anneals corresponding to reactor conditions prior to growth for the samples in Panels (a) (Regime 1), (d) (Regime 2), and (i) (Regime 3) of FIG. 5 were carried out on (001) and (111) Si, and the silicon was analyzed with XPS. FIG. 6 shows the As $2p_{3/2}$ peaks measured after the anneals. The curves were normalized to the As $3^-$ peak. From this peak, it may be seen that for the highest temperature condition (800° C., effective V/III=5,000) no As remains on either (111) or (001) surfaces prior to growth. Quantitative results showed that the As/P ratio is higher for (111) samples than (001) for a given growth condition when As is still present. The As/P ratio also decreases with temperature.

Chemical information from the XPS results shows a notable difference between the (001) surfaces from the condition corresponding to Regime 1 compared to all of the other conditions as well as the (111) surface exposed to the same conditions. Panel (b) of FIG. 6 shows that this can be explained by the presence of an $As^0$ peak, suggesting the presence of excess As on the surface past the first monolayer. The imperfect fit suggests that there is a fourth intermediate oxidation state of As present as well. The $As^0$ peak is negligible in all other cases.

Figure 7:
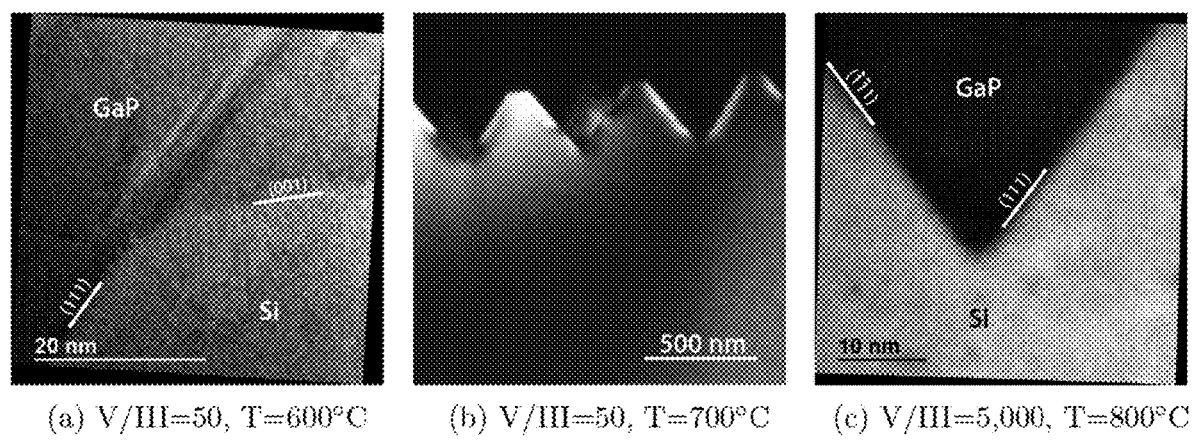
FIG. 7 illustrates high resolution TEM images of the three nucleation regimes, according to some embodiments of the present disclosure. Regime 1, Panel (a), shows a high density of planar defects and twinning. Regime 2, Panel (b), shows planar defects forming on the (111) planes intersecting the (111) planes of the v-grooves. Regime 3, Panel (c), is completely free of planar defects.

FIG. 7 shows high resolution cross sectional TEM imaging corresponding to Panels a (Regime 1), d (Regime 2), and i (Regime 3), respectively, of FIG. 5. In Regime 1, where growth begins primarily on the (001) surface, the material is highly defective with a high density of twinning. In Regime 2, stacking faults are present and propagate primarily on the (111) planes that intersect the v-groove sidewalls. In Regime 3, the GaP appears to be defect free in both the high-resolution images and in (220) dark-field images (not shown). This high temperature regime did not produce any interfacial planar defects. Additionally, there are no voids at the bottom of the v-grooves, which is typically seen.

There are a number of considerations in determining which nucleation has the most potential for producing high quality thin films. For the v-grooves to realize their full benefit, nucleation should start at the bottom or sidewalls of the v-grooves, possibly to coalesce into a smooth thin film, and should produce material that is low in defect density. Based on these criteria, Regime 1 (Panel a of FIG. 5) nucleation does not appear to show promise for III-V/Si thin films. Nucleation there begins primarily on the top surface, and the TEM results show that this indeed gives rise to low material quality. Regime 2 (Panel d of FIG. 5) shows two potential problems: TEM shows a tendency for planar defects to form, and the island-like nucleation would likely make it difficult to coalesce into a thin film. Regime 3 (Panel i of FIG. 5) shows the most promise for the experiments described herein. Nucleation begins exclusively on the sidewalls towards the bottom of the v-grooves, the nuclei are long and uniform, which has potential for smooth coalescence and TEM showed that the material is free of planar defects present in other regimes. The high-quality, defect-free interface also has promise for devices like solar cells that use the silicon as an active component.

An interesting observation from FIGS. 4 and 5 is that by changing reaction conditions, it is possible to control which crystal facet nucleation begins. V/III ratio, temperature, and surface pretreatment all influence facet selectivity. Understanding why this happens is difficult because of the complexity of the system. As shown in FIG. 3, there are four unique locations where nucleation can begin, likely all with different sticking coefficients. Additionally, as the XPS results show, silicon surface chemistry changes significantly during the nucleation process, and the different crystal facets undergo these changes at different rates.

However, some of the SEM results suggest a possible mechanism for the different regimes based on Group III surface mobility. From lower magnification SEM images of the nucleation, it can be seen (not shown) that nucleation for many conditions starts exclusively at the bottom of v-grooves, and for conditions with top surface growth (Regime 1), there is still some growth at the bottom of v-grooves. Additionally, top growth tends to occur at lower temperatures and higher V/III ratios, which is expected to correspond to lower Group III mobility. This suggests that the bottom interface has a much higher sticking coefficient than all other surfaces present on the v-grooves, followed by an intermediate sticking coefficient on the top surface. Another possibility of what makes the bottom of the v-groove unique is its curvature. The Kelvin equation predicts that areas of high curvature have a thermodynamic driving force to become smoother. For conditions where mobility is high enough that Group III atoms diffuse off the top surface, they travel over the highly passivated sidewall surface before becoming stuck at the bottom interface, causing nucleation to begin. In cases where mobility is lower, Group III atoms that absorb to the top tend to stay there, and other atoms that absorb initially to the sidewalls still end up diffusing to the bottom of the v-grooves due to the low sticking coefficient of the sidewalls. The difference in selectivity from pretreatment could come from one of two mechanisms: the $H_2$ anneal either does not passivate the (001) plane as well as $AsH_3$, or it does not clean the surface of oxygen as well, causing heterogeneous nucleation at points with contamination.

Study of the factors controlling nucleation on v-groove silicon was carried out for OMVPE-grown GaP in a high-temperature regime. Growth temperature, III/V ratio, and surface pretreatment were all found to influence the facet selectivity of the nucleation. Three regimes have different nucleation locations and shape of nuclei. XPS measurements were carried out on the three regimes to understand the surface chemistry prior to growth, and this was found to vary depending on crystallographic orientation and growth conditions. High V/III ratio and high temperature results in GaP nucleation exclusively in the bottoms of v-grooves, which is desirable for high-quality GaP growth. TEM showed this condition produces defect-free GaP, making it a promising candidate for high-quality GaP on Silicon growth. This demonstrates the possibility to use of $AsH_3$ pre-growth annealing and high temperature nucleation on v-groove substrates.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising:
   directing a first precursor comprising a Group III element and a second precursor comprising a Group V element to a chamber containing crystalline silicon, wherein:
   the crystalline silicon comprises a substantially planar surface that is patterned with a plurality of v-grooves,
   each v-groove is characterized by a triangular cross-section defined by a bottom positioned between a first top and a second top,
   the bottom and the first top form a first sidewall,
   the bottom and the second top form a second sidewall,
   each sidewall comprises a (111) Si surface,
   the second precursor and the first precursor are provided at a ratio between about 50:1 and about 50,000:1,
   the chamber is maintained at a temperature between about 600° C. and about 1000° C., and
   the directing results in the forming of a III-V crystal preferentially on the (111) Si surface.

2. The method of claim 1, wherein the top comprises a silicon surface other than a (111) Si surface.

3. The method of claim 2, wherein the top comprises a (001) Si surface.

4. The method of claim 1, wherein the ratio is between about 1,000:1 and about 10,000:1.

5. The method of claim 1, wherein the temperature is between about 700° C. and about 900° C.

6. The method of claim 5, wherein the temperature is between about 650° C. and about 850° C.

7. The method of claim 1, wherein the chamber is maintained at a pressure between about 1 Torr and about 800 Torr.

8. The method of claim 7, wherein the pressure is between about 500 Torr and about 760 Torr.

9. The method of claim 7, wherein the pressure is between about 1 Torr and about 100 Torr.

10. The method of claim 1, wherein the Group III element comprises at least one of gallium, indium, or aluminum.

11. The method of claim 1, wherein the Group V element comprises at least one of phosphorus, arsenic, or nitrogen.

12. The method of claim 1, wherein the III-V crystal comprises at least one of GaP, GaAs, InP, InAs, GaAsP, GaNP, or GaInP.

13. The method of claim 1, further comprising, prior to the directing:
   a first initial directing of at least one of arsine ($AsH_3$) or tertiary-butylarsine (TBAs) to the chamber, wherein:
   the chamber is maintained at a first initial temperature between 900° C. and 1000° C., and the first initial directing modifies the (111) Si surface.

14. The method of claim 13, further comprising, after the first initial directing and prior to the directing:
   a second initial directing of at least one of phosphine ($PH_3$) or TBAs to the chamber, wherein:
   the chamber is maintained at a second initial temperature between 850° C. and 1100° C., and
   the second initial directing modifies the (111) Si surface.

15. The method of claim 1, wherein the III-V crystal coalesces to a conformal coating that covers substantially all of the surface.

16. The method of claim 15, wherein the conformal coating is substantially planar.

17. The method of claim 16, wherein the conformal coating comprises GaP.

18. The method of claim 1, wherein a distance normal to the surface between the top and the bottom defines a depth that is between about 10 nm and 10 µm.

19. The method of claim 1, wherein a distance between adjacent tops defines a width that is between about 10 nm and 10 µm.

20. The method of claim 17, wherein the conformal coating has thickness between about 1 nm and 10 μm, as measured from the top of the v-groove to an outer surface of the conformal coating.

* * * * *